United States Patent
Wilcox et al.

(10) Patent No.: US 10,701,464 B2
(45) Date of Patent: Jun. 30, 2020

(54) HANDLE FOR INSERTION AND REMOVAL OF NETWORK COMPONENT

(71) Applicant: Arista Networks, Inc., Santa Clara, CA (US)

(72) Inventors: Robert Wilcox, Santa Clara, CA (US); RIchard Hibbs, Santa Clara, CA (US); Youngbae Park, Santa Clara, CA (US); Ian Fry, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 1 day.

(21) Appl. No.: 16/118,319

(22) Filed: Aug. 30, 2018

(65) Prior Publication Data
US 2020/0077165 A1 Mar. 5, 2020

(51) Int. Cl.
*H05K 7/00* (2006.01)
*H04Q 1/14* (2006.01)
*H05K 7/14* (2006.01)

(52) U.S. Cl.
CPC ............ *H04Q 1/14* (2013.01); *H05K 7/1401* (2013.01); *H04Q 2201/802* (2013.01); *H05K 7/1489* (2013.01)

(58) Field of Classification Search
None
See application file for complete search history.

(56) References Cited

U.S. PATENT DOCUMENTS

| | | | | |
|---|---|---|---|---|
| 4,840,570 A | * | 6/1989 | Mann, Jr. ........... | H01R 12/7005 439/74 |
| 6,252,514 B1 | * | 6/2001 | Nolan ..................... | G06F 1/183 340/686.4 |
| 6,619,971 B1 | * | 9/2003 | Chen .................... | G06K 7/0047 439/159 |
| 6,739,890 B2 | * | 5/2004 | Hirata .................. | G06K 7/0034 439/159 |
| 7,420,820 B1 | * | 9/2008 | Lima .................... | H05K 7/1407 312/223.2 |
| 7,679,933 B2 | * | 3/2010 | Makabe ................. | G06F 1/185 174/365 |
| 7,684,208 B2 | * | 3/2010 | Okamoto ............. | H05K 7/1487 361/754 |

(Continued)

*Primary Examiner* — Jinhee J Lee
*Assistant Examiner* — Rashen E Morrison
(74) *Attorney, Agent, or Firm* — Fountainhead Law Group P.C.

(57) ABSTRACT

In one embodiment, an apparatus is provided. The apparatus includes a latching component configured to secure a network component within a chassis of a network device when the apparatus is in a first configuration. The latching component is also configured to allow removal of the network component from the chassis of the network device when the apparatus is in a second configuration. The apparatus also includes a handle component coupled to the latching component. The handle component is accessible from a first face of the network component. The handle component is oriented away from the first face. The handle component is configured to facilitate the removal of the network component from the chassis when the apparatus is in the first configuration. The handle component is also configured to facilitate the insertion of the network component into the chassis when the apparatus is in the second configuration.

20 Claims, 11 Drawing Sheets

(56) References Cited

U.S. PATENT DOCUMENTS

| | | | | |
|---|---|---|---|---|
| 8,289,707 B2* | 10/2012 | Liao | ...................... | H04Q 1/023 |
| | | | | 361/679.58 |
| 2002/0135987 A1* | 9/2002 | Baldwin | ................ | H05K 7/142 |
| | | | | 361/730 |
| 2015/0237749 A1* | 8/2015 | Boetzer | ................ | H05K 5/0221 |
| | | | | 403/322.4 |
| 2016/0128230 A1* | 5/2016 | Lam | ................... | H05K 7/20727 |
| | | | | 361/695 |

* cited by examiner

HANDLE FOR INSERTION AND REMOVAL OF NETWORK COMPONENT

BACKGROUND

Network devices, such as switches, routers, hubs, servers (e.g., rackmount servers) may include a chassis with one or more slots. Network components, such as line cards, may be inserted into the slots. The network components may perform various functions that may be used during the operation of the network device. For example, a switch may include multiple line cards that are inserted into multiple slots in the chassis of the switch. Each of the line cards may be coupled to other network devices (e.g., to ports of other switches), to other line cards within the same network device, and/or to different networks. Each network component may be coupled to a fabric of the network device via one or more connectors inside the chassis of the network device. For example, each network component may include a connector that may be coupled to another connector on a fabric or a mid-plane of the network device. The fabric may allow the different network components to communicate data with each other. For example, the fabric may allow data received from a first port of a first line card to be communicated (e.g., routed) to a second port of a second line card.

SUMMARY

In some implementations, an apparatus is provided. The apparatus includes a latching component configured to secure a network component within a chassis of a network device when the apparatus is in a first configuration. The latching component is also configured to allow removal of the network component from the chassis of the network device when the apparatus is in a second configuration. The apparatus also includes a handle component coupled to the latching component. The handle component is accessible from a first face of the network component. The handle component is oriented away from the first face. The handle component is configured to facilitate the removal of the network component from the chassis when the apparatus is in the first configuration. The handle component is also configured to facilitate the insertion of the network component into the chassis when the apparatus is in the second configuration.

In some implementations, an apparatus is provided. The apparatus includes a latching component configured to secure a network component within a chassis of a network device when the apparatus is in a first configuration. The latching component is also configured to allow removal of the network component from the chassis of the network device when the apparatus is in a second configuration. The apparatus also includes a handle component coupled to the latching component. The handle component is accessible from a first face of the network component. The handle component is oriented away from the first face. The handle component is configured to facilitate the removal of the network component from the chassis when the apparatus is in the first configuration. The handle component is also configured to facilitate the insertion of the network component into the chassis when the apparatus is in the second configuration.

In some implementations, an apparatus is provided. The apparatus includes a latching component configured to secure a network component within a chassis of a network device when the apparatus is in a first configuration. The latching component is also configured to allow removal of the network component from the chassis of the network device when the apparatus is in a second configuration. The apparatus also includes a handle component coupled to the latching component along with a spring. The handle component and the direction in which the handle component may move, may be configured to reduce the amount of space used on the face (e.g., a front face) of the network component. The spring may interface with the handle and the latching component to push the network device to the chassis. Thus although there may be manufacturing tolerances in the network device or chassis, the network device is pushed into the chassis and the mating of the connectors between the network device and the chassis is maintained more reliably.

In some implementations a method is provided. The method includes aligning a network component with a slot in a chassis of a network device. The network component includes a securing mechanism, and the securing mechanism includes a latching component and a handle component. The method also includes pushing the handle component towards the inside of the chassis of the network device. The handle component is accessible from a first face of the network component. The handle component is oriented away from the first face. Pushing the handle causes a spring of the handle component to compress, a set of contact features to interface with a set of prongs of a handle cover, and a set of engagement features of the latching component to engage with a set of retention features in the chassis of the network device to secure the network component in the chassis. The method further includes pulling the handle away from the inside of the chassis of the network device. Pulling the handle causes a set of tabs to interface with the set of prongs, the set of contact features to move past the set of prongs, the spring to decompress, the set of engagement feature to disengage with the set of retention features to allow removal of the network component from the chassis.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

As discussed above, network devices may include a chassis with one or more slots. Network components, such as line cards, may be inserted into the slots. The network components (e.g., line cards) should generally be secured to the chassis of the network device once the network components are installed in the network device (e.g., inserted into the slots of the chassis of the network device). This may prevent damage to the network components. For example, this may prevent accidental removal of a network component from the network device while the network component and/or network device are in operation. Preventing the accidental removal may prevent the network device and/or network component from physical damage and/or electrical damage (e.g., electrical damage to circuits, processors, memory, etc., of the network device and/or network components). This may allow the network components to operate properly. For example, the chassis of the network device may have mechanical tolerances that may cause the connectors in a network component to have problems fully coupling with connectors within the network device (e.g., may cause the connectors in the network component to not be fully inserted into connectors in the network device). In addition, line cards with more functionality and/or component may use of more of the face of the line card (e.g., to support additional portions). Furthermore, the mating between the connectors of the line card and the connectors in the chassis should be mechanically reliable. This may help the line card and/or the connectors coupled to the line card operate more reliability and/or may increase the performance of the connectors. Thus it may be useful to have one or more components on the line card which can help achieve mechanical reliable mating of the connectors of the line card, while reduce the foot print or the amount of space used on the face (e.g., faceplate) of the line card.

Figure 1:
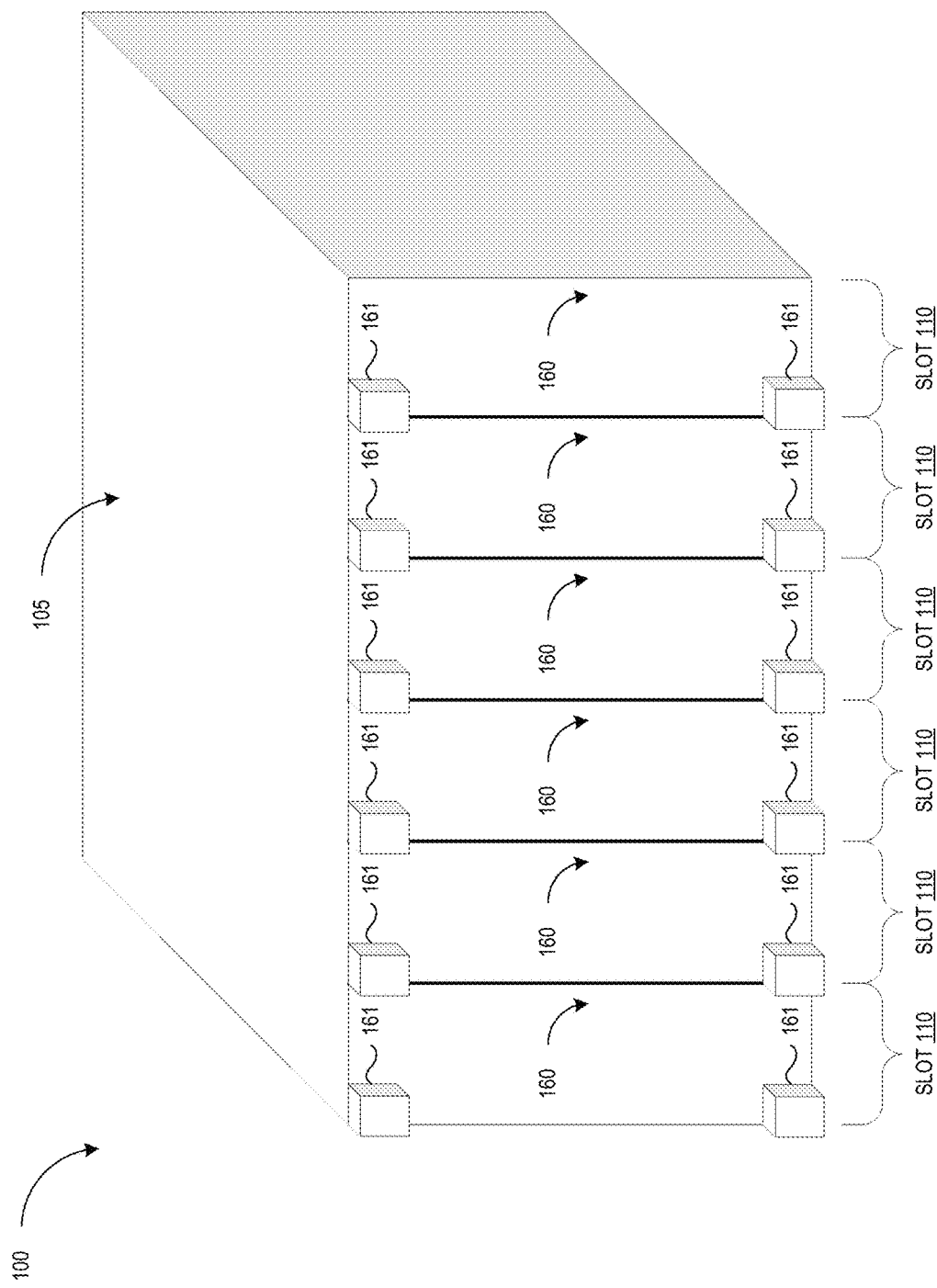
FIG. 1 illustrates a perspective view of network device in accordance with one or more embodiments of the present disclosure.

FIG. 1 illustrates a perspective view (e.g., an isometric view) of network device 100 in accordance with one or more embodiments of the present disclosure. The network device includes a chassis 105. The chassis 105 may enclose components (e.g., circuits, processing devices, memory, circuit boards, power supplies, etc.) of the network device 100. The chassis 105 may also enclose (fully or partially) the network components 160 (e.g., line cards). The network device 100 includes multiple slots 110. A network component 160 may be inserted into each of the slots 110.

As discussed above, the network components 160 should generally be secured to the chassis 105 of the network device 100 once the network components 160 are inserted into the slots 110 of the chassis 105 of the network device 100. As illustrated in FIG. 1, ejectors 161 (e.g., rotating ejectors or latches) may be used to secure the network components 160 within the chassis 105. For example, as the ejectors 161 are rotated towards the middle of the network components 160, the ejectors 161 may interface with the chassis 105 (e.g., contact different portions or features of the chassis 105) to push the network components 160 into the slots 110 and to prevent removal of the network components 160 (e.g., to secure the network components 160 within the slots 110 and the chassis 105).

The ejectors 161 occupy space on the front face of the network components 160. Thus, the ejectors 161 reduce the amount of space on the front face of the network components 160. Reducing the amount of space on the front face of a network component 160 may reduce the number of ports, connectors, labels (e.g., stickers, writing, etc.), displays, light emitting diodes (LEDs), etc., that may be positioned on the face of the network component 160. This may result in a less efficient use of the network component 160 and may cause inconvenience to users of the network device 100. For example, if less space is available on the face of the network component, fewer LEDs may be used to convey the status of ports, links, etc., provided by the network component. In addition, if less space is available on the face of the network component, the cooling or air flow capability of the network component 160 may be reduced, because the space that was used by the ejectors 161 may prevent additional vents or openings from being positioned on the face of the network component 160. Also, a user generally operates both of the ejectors 161 at the same time using both hands. Failure to use both hands to operate both of the ejectors 161 at the same time may result in the tilting, bending, or warping of the network components 160 during removal and which may cause mechanical damage to the network component 160 or chassis 105.

Figure 2:
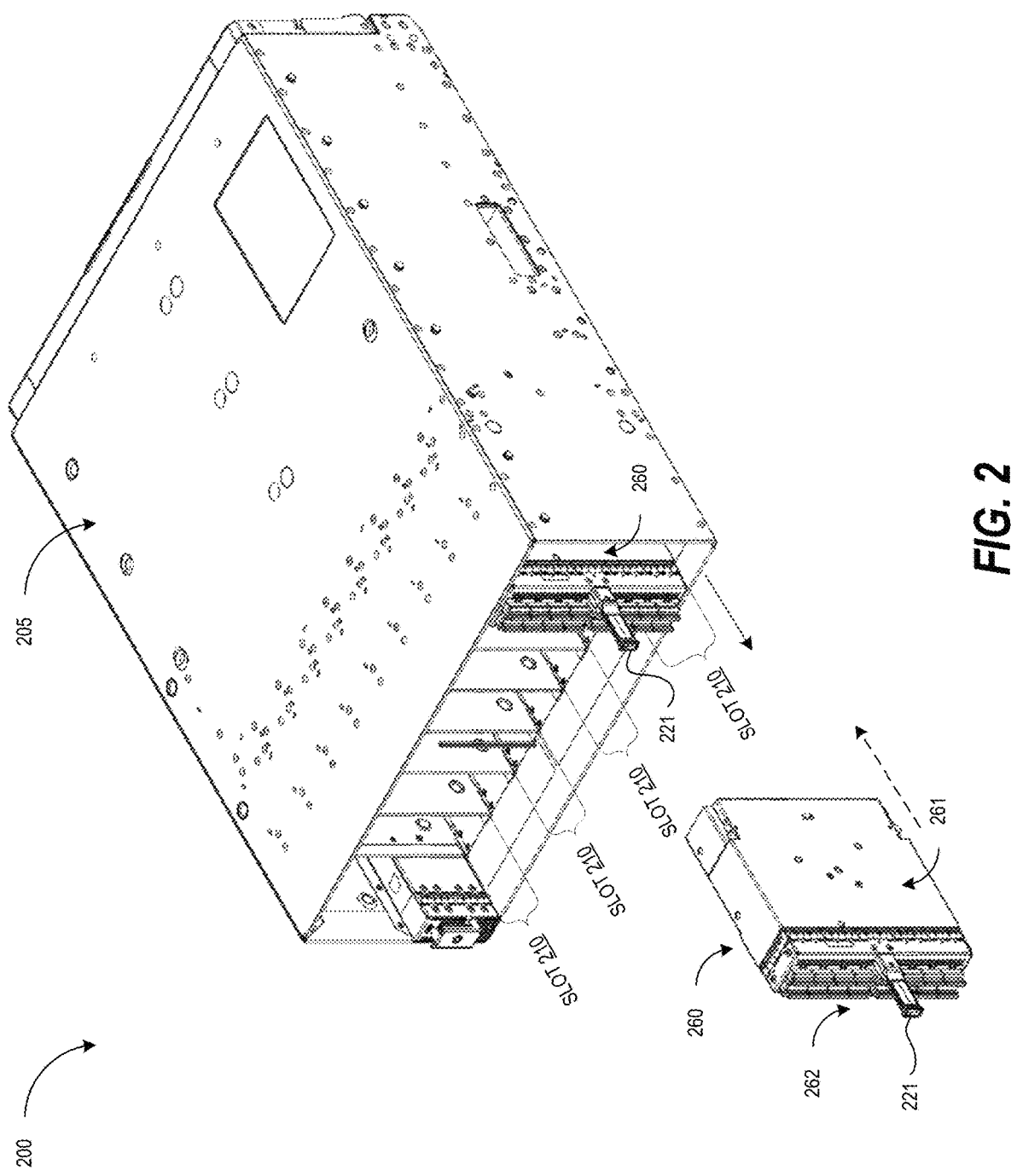
FIG. 2 illustrates a perspective view of network device in accordance with one or more embodiments of the present disclosure.

FIG. 2 illustrates a perspective view (e.g., an isometric view) of network device 200 in accordance with one or more embodiments of the present disclosure. The network device includes a chassis 205. The chassis 205 may enclose components (e.g., circuits, processing devices, memory, circuit boards, power supplies, etc.) of the network device 200. The chassis 205 may also enclose (fully or partially) the network components 260 (e.g., line cards). The network device 200 includes multiple slots 210. A network component 260 may be inserted into each of the slots 210.

As discussed above, the network components 260 should generally be secured to the chassis 205 of the network device 200 once the network components 260 are inserted into the slots 210 of the chassis 205 of the network device 200. This may prevent damage to the network components 160 and/or network device 110, and may allow the network components 260 and/or network device 200 to operate properly.

As illustrated in FIG. 2, a network component 260 includes a housing 261. The network component also includes a securing mechanism (illustrated and discussed in more detail below) that is disposed or located at least partially within the housing 261. The securing mechanism includes a latching component (illustrated and discussed in more detail below) configured to secure the network component 260 within the chassis 205 of a network device when the securing mechanism is in a first configuration (e.g., a locked configuration, a closed configuration, a secured configuration, etc.). The latching component is also configured to allow removal of the network component 260 from the chassis 205 when the apparatus is in a second configuration (e.g., an open configuration, an unsecured configuration, etc.). The securing mechanism further includes a handle component (illustrated and discussed in more detail below) coupled to the latching component. The handle component may be configured to facilitate the removal of the network component 260 from the chassis 205 when the securing mechanism is in the first configuration. The handle component may also be configured to facilitate the insertion of the network component into the chassis when the apparatus is in the second configuration. The handle component may be accessible from a first face 262 (e.g., a front face) of the network component 260. For example, the handle component may include a handle 221 that is accessible by a user from the front of the network component 260. The handle component may also be oriented away from the first face 262 of the network component 260 (e.g., the handle component may point away from the first face 262 of the network component 260). The components, portions, and operation of the securing mechanism are discussed in more detail below.

As illustrated in FIG. 2, one network component 260 is inserted into a slot 210 of the chassis 205. The securing mechanism of the network component 260 that is inserted into the slot 210 may be in a first configuration (e.g. a locked/closed/secured configuration). As the handle 221 of the handle component is pulled by the user in the direction indicate by the dotted arrow, the securing mechanism may allow the network component 260 to be removed from the chassis 205 (e.g., from the slot 210), as discussed in more detail below. When the securing mechanism is in the first configuration, the handle component may facilitate the removal of the network component 260 from the chassis of the network device. For example, the handle may allow a user to pull on the handle which may operate components of the securing mechanism to help remove the network component 260, as discussed in more detail below.

Also as illustrated in FIG. 2, one network component 260 is outside of the chassis 205. The securing mechanism of the network component 260 that is outside of the chassis 205 may be in a second configuration (e.g. an open/unsecured configuration). As the handle 221 of the handle component is pushed by the user in the direction indicated by the dashed arrow, the securing mechanism may secure the network component 260 within the chassis 205, as discussed in more detail below. When the securing mechanism is in the second configuration, the handle component may facilitate the insertion of the network component 260 into the chassis of the network device. For example, the handle may allow a user to push the handle which may operate components of the securing mechanism to help insert the network component 260, as discussed in more detail below.

As illustrated in FIG. 2, the handle 221 provides a single component that the user may use to insert and eject the network component 260. For example, instead of using two hands for two ejectors, the user may be able to insert and remove the network component 260 using one hand. In addition, the network components 260 do not use ejectors or latches that may reduce the amount of space on the face of the network component 260. Instead, a single handle may be used and the single handle may use less space on the face of the network component 260 than the latches/ejectors. This may allow additional ports, vents, LEDs, etc., to be added to the network component 260. This may help increase the capabilities of the network component 260 (e.g., increase the number of ports in the network component 260) and may improve the operation of the network component 260 (e.g., allow for more airflow which may result in better cooling).

Figure 3A:
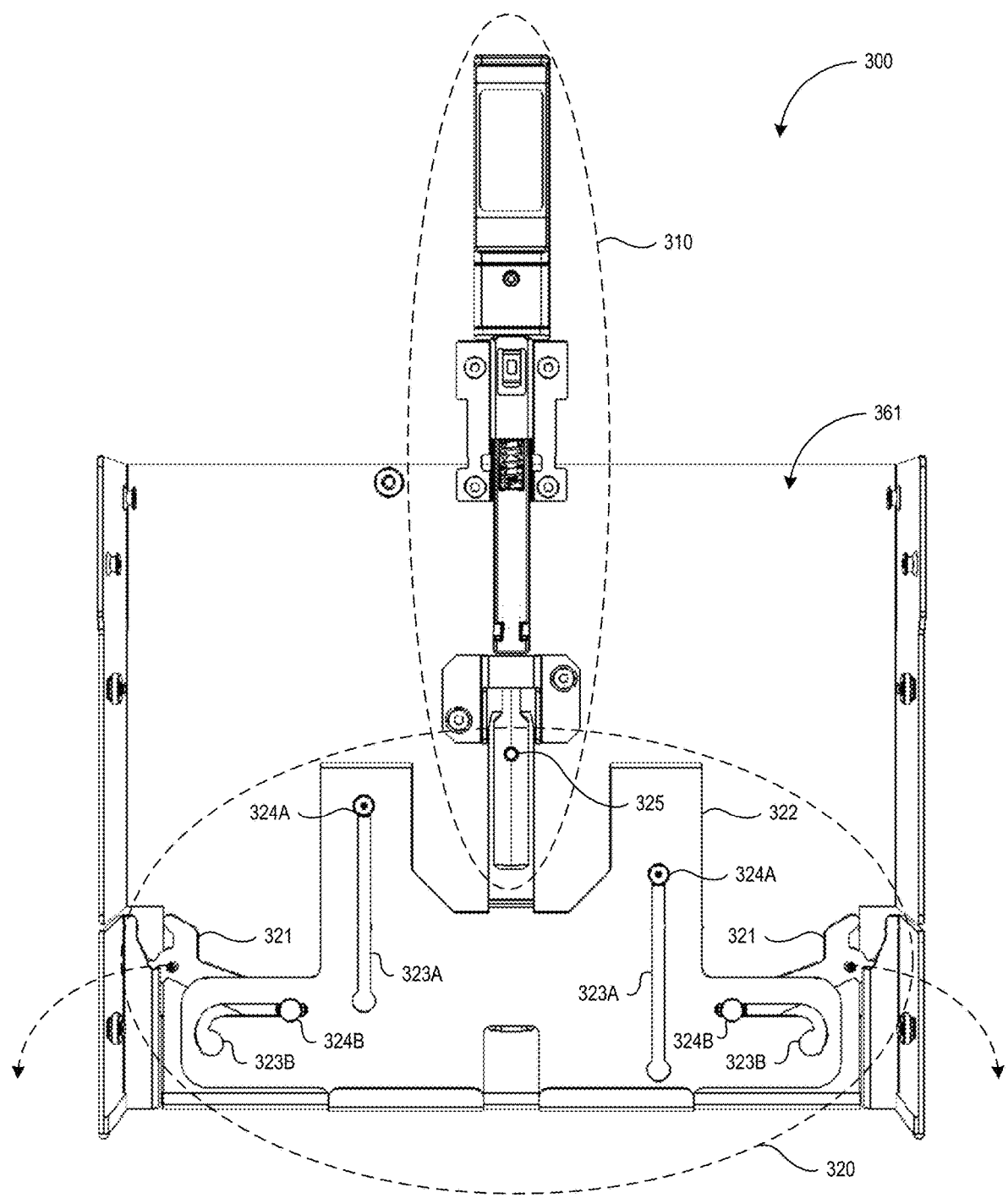
FIG. 3A is an overhead view of the bottom of a securing mechanism, in accordance with one or more embodiments of the present disclosure.

FIG. 3A is an overhead view of the bottom of a securing mechanism 300, in accordance with one or more embodiments of the present disclosure. The securing mechanism 300 includes a latching component 310 and a handle component 320. The securing mechanism may be coupled or attached to a housing 361 of a network component via various attachment features such as screws, buttons, tabs, nuts/bolts, etc. The securing mechanism 300 illustrated in FIG. 3 may be in a locked/closed/secured configuration which may prevent the removal of the network component from a chassis of a network device. As illustrated in FIG. 3A, the latching component 310 may be located or disposed within the housing 361 of the network component. Also as illustrated in FIG. 3A, the handle component 320 may be partially located or disposed within the housing 361. The handle component 320 is located along a central axis of the securing mechanism 300. The handle component 320 may also be located along a central axis of the network component. The handle component 320 is discussed in more detail below.

In one embodiment, the latching component 320 includes engagement features 321. The engagement features 321 may have a paw shape or a wrench shape. The paw shape of the engagement features 321 may interface (e.g., contact, push against, etc.) retention features in the chassis of the network device. For example, the engagement features 321 may push against one or more tabs on the chassis of the network device. This may prevent the network component from being removed. The engagement features 321 are illustrated as being in a first position when the securing mechanism 300 is in the locked/closed/secured configuration. The engagement feature 321 may move to a second position when the securing mechanism 300 is in an open/unsecured configuration, as illustrated by the curved dashed arrows and as discussed in more detail below.

In one embodiment, the latching component 320 includes a plate 322 coupled to engagement features 321 and the handle component 310. The plate 322 includes grooves 323A and 323B. Screws 324A couple the plate 322 to the housing 361. The screws 324A allow the plate 322 to move between a first position (illustrated in FIG. 3A) and a second position. The plate 322 may be in the first position when the securing mechanism 300 is in the locked/closed/secured configuration. The screws 324B allow the engagement features 321 to move in the directions indicated by the dashed arrows. For example, when a user pulls the handle component 310, the plate 322 may move upwards (to a second position) and the each engagement feature 321 may rotate downwards (as indicated by the dashed arrows) to a second position.

Figure 3B:
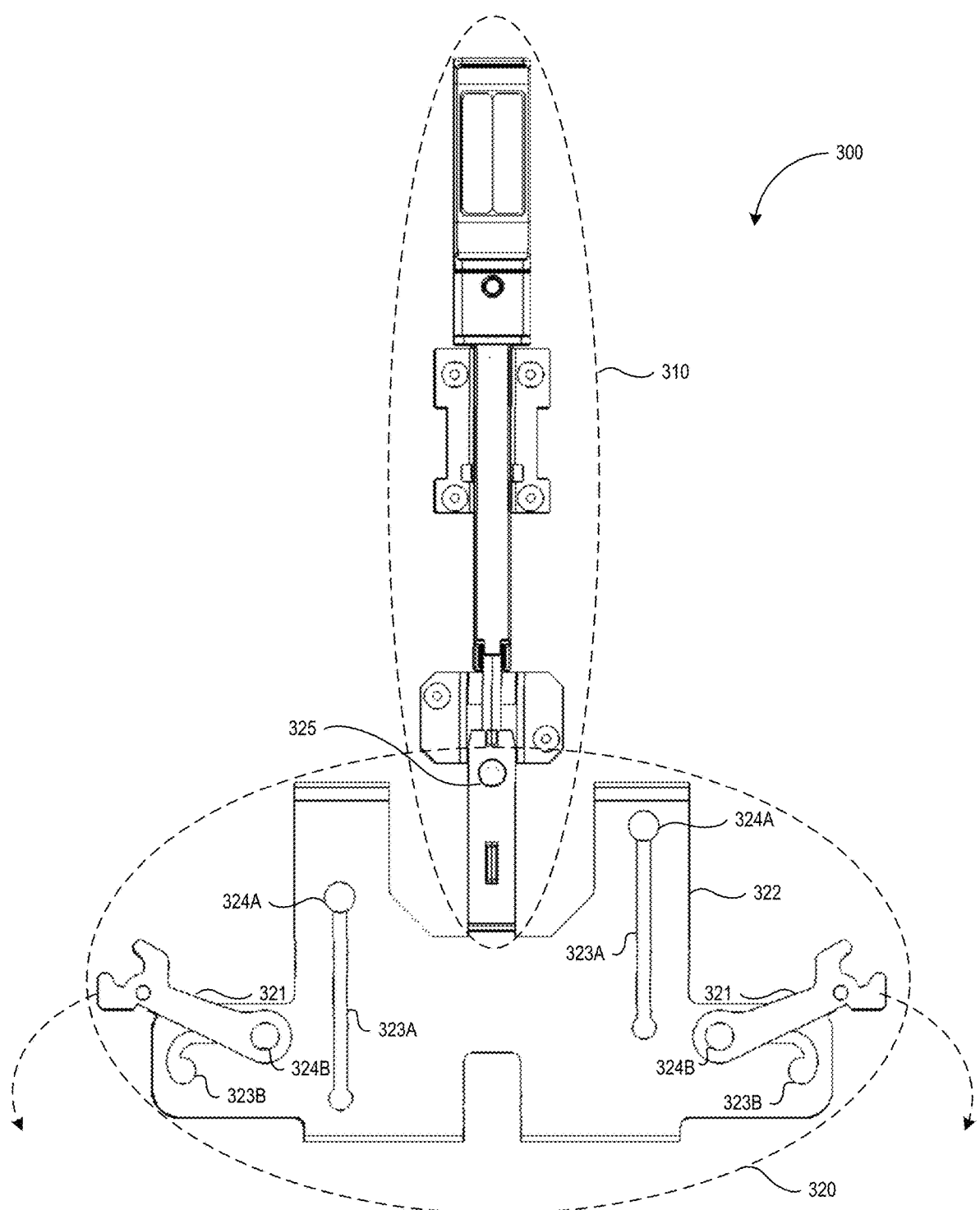
FIG. 3B is an overhead view of the top of a securing mechanism, in accordance with one or more embodiments of the present disclosure.

FIG. 3B is an overhead view of the top of a securing mechanism 300, in accordance with one or more embodiments of the present disclosure. As discussed above, the securing mechanism 300 includes a latching component 310 and a handle component 320. The securing mechanism may be coupled or attached to a housing 361 of a network component via various attachment features such as screws, buttons, tabs, nuts/bolts, etc. The securing mechanism 300 illustrated in FIG. 3 may be in a locked/closed/secured configuration which may prevent the removal of the network component from a chassis of a network device. As illustrated in FIG. 3B, the latching component 310 may be located or disposed within the housing 361 of the network component. Also as illustrated in FIG. 3B, the handle component 320 may be partially located or disposed within the housing 361. The handle component 320 is discussed in more detail below.

The latching component 320 includes engagement features 321. The shape of the engagement features 321 may interface (e.g., contact, push against, etc.) retention features in the chassis of the network device. This may prevent the network component from being removed. The engagement features 321 are illustrated as being in a first position when the securing mechanism 300 is in the locked/closed/secured configuration. The engagement feature 321 may move to a second position when the securing mechanism 300 is in an open/unsecured configuration, as illustrated by the curved dashed arrows and as discussed in more detail below. The latching component 320 includes a plate 322 coupled to engagement features 321 and the handle component 310. The plate 322 includes grooves 323A and 323B. Screws 324A couple the plate 322 to the housing 361. The screws 324A allow the plate 322 to move between a first position (illustrated in FIG. 3B) and a second position. The plate 322 may be in the first position when the securing mechanism 300 is in the locked/closed/secured configuration. The screws 324B allow the engagement features 321 to move in the directions indicated by the dashed arrows.

Figure 3C:
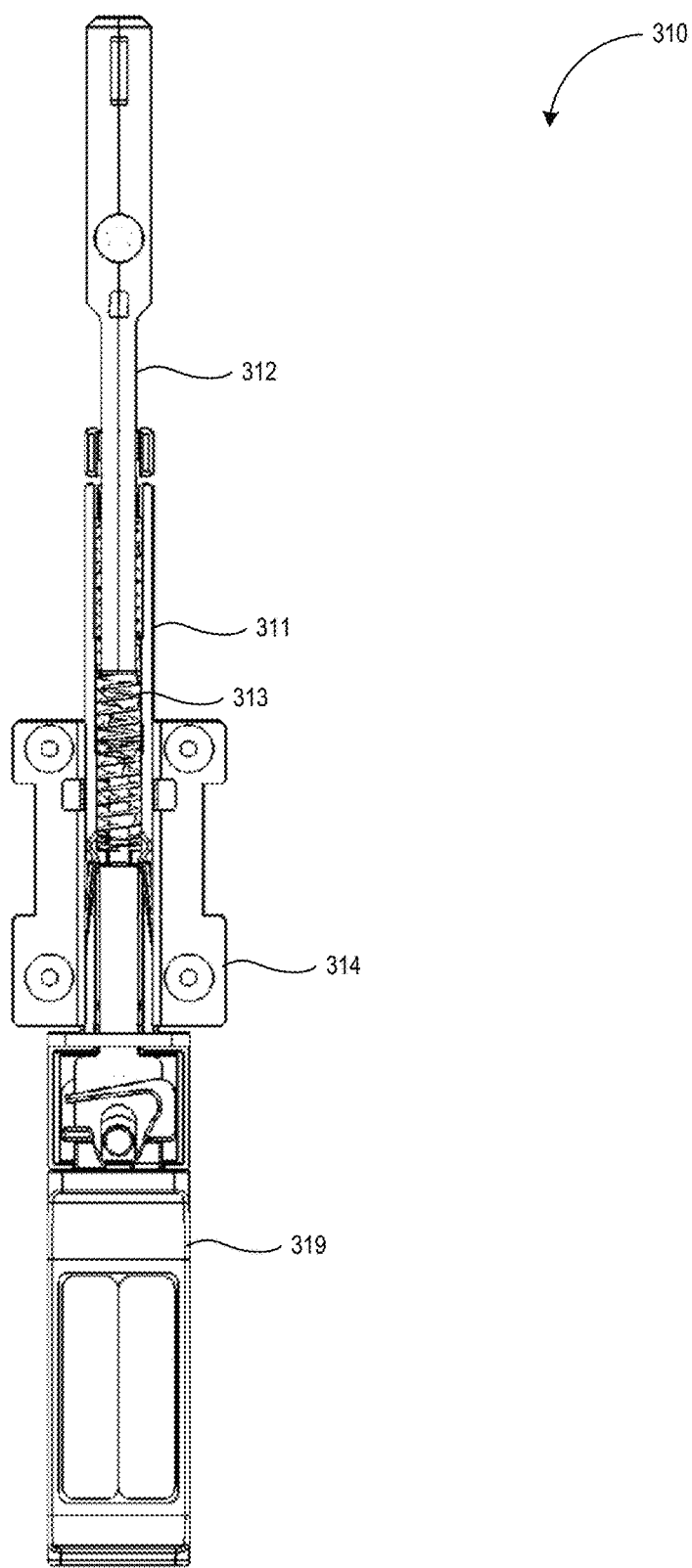
FIG. 3C is an overhead view of the bottom of the handle component in accordance with one or more embodiments of the present disclosure.

FIG. 3C is an overhead view of the bottom of the handle component 310 in accordance with one or more embodiments of the present disclosure. The handle component includes a handle housing 311, a shaft 312, and a spring 313. The shaft is located at least partially within the handle housing 311. The spring 313 interfaces with the shaft 312. For example, the spring 313 may wrap around an elongated protrusion of the shaft 312. The spring 313 is at least partially located or disposed within the handle housing 311. A portion of the handle housing 311 has been removed to better illustrate the shaft 312 and the spring 313. The removed portion of the housing 311 may cover portions of the shaft and the spring 313. The handle component 310 also includes a handle 319 that allows the user to hold onto the handle 319 to pull or push the handle component 310. The handle component 310 also includes a handle cover 314. The handle cover 314 may include a grove that may guide the movement of the handle housing 311.

Figure 3D:
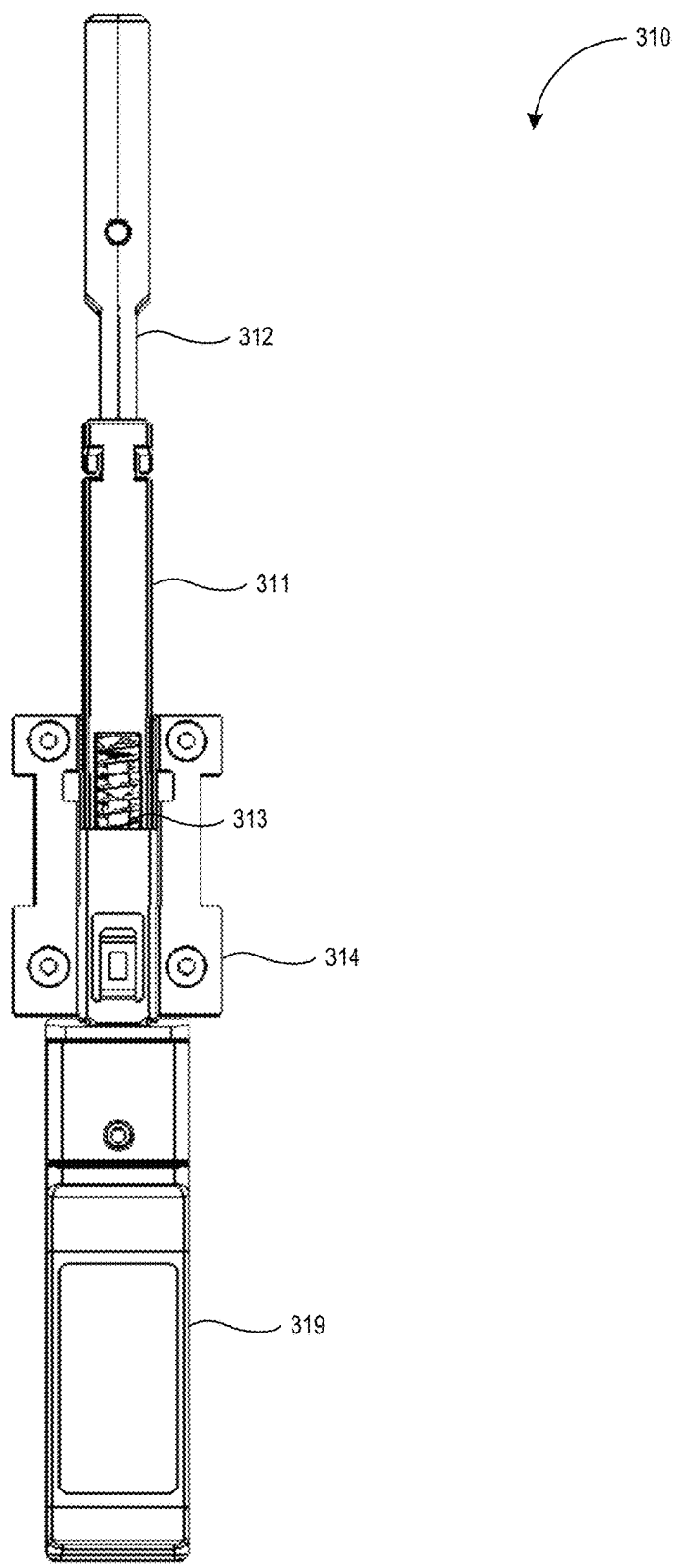
FIG. 3D is an overhead view of the top of the handle component in accordance with one or more embodiments of the present disclosure.

FIG. 3D is an overhead view of the top of the handle component 310 in accordance with one or more embodiments of the present disclosure. The handle component includes a handle housing 311, a shaft 312, and a spring 313. The shaft is located at least partially within the handle housing 311. The spring 313 interfaces with the shaft 312. The spring 313 is at least partially located or disposed within the handle housing 311. The handle component 310 also includes a handle 319 that allows the user to hold on the handle 319 to pull or push the handle component 310. The handle component 310 also includes a handle cover 314. The handle cover 314 may include a grove that may guide the movement of the handle housing 311.

Figure 3E:
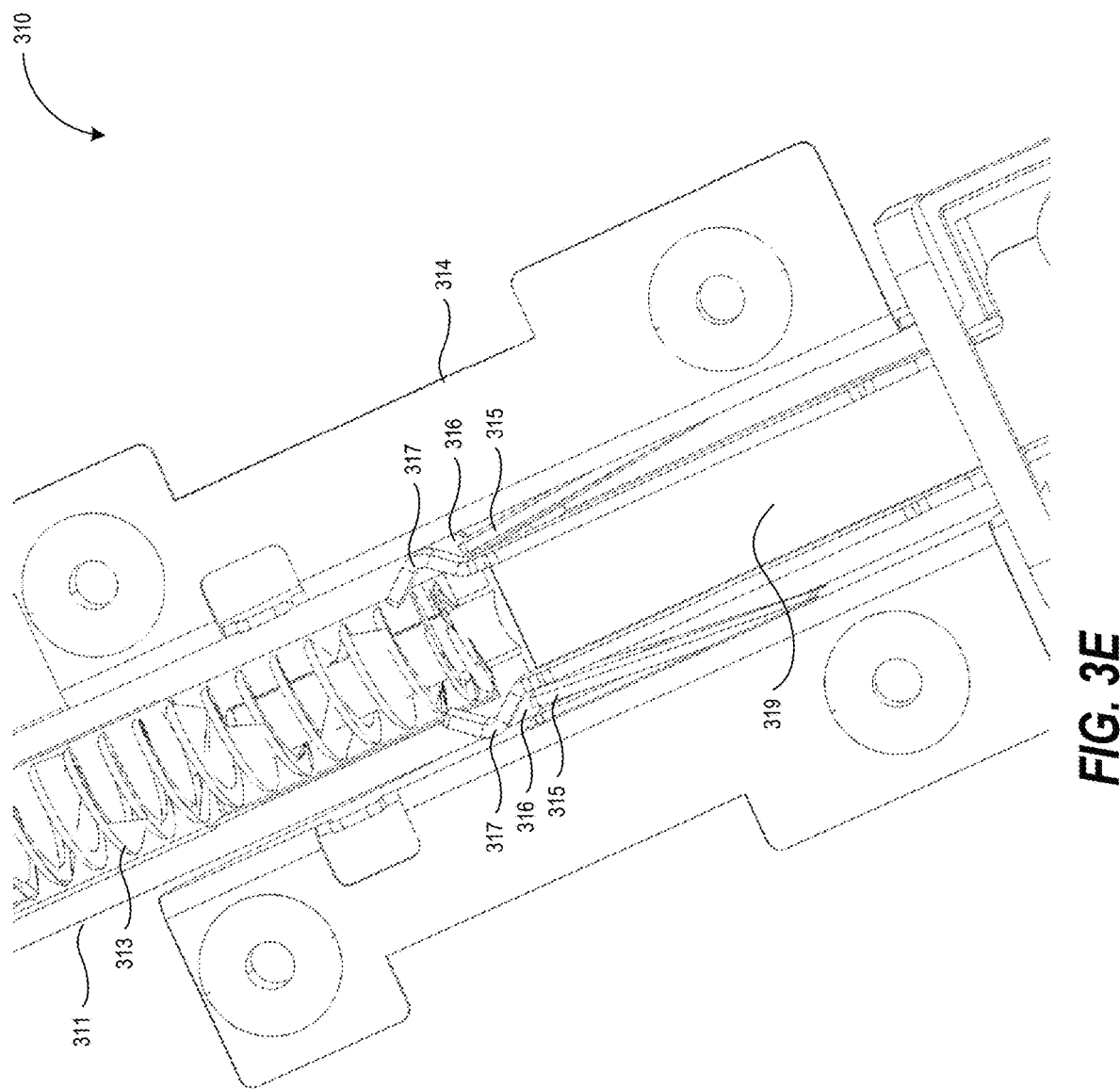
FIG. 3E is a perspective view of a portion of the handle component in accordance with one or more embodiments of the present disclosure.

FIG. 3E is a perspective view of a portion of the handle component 310 in accordance with one or more embodiments of the present disclosure. The handle component includes a handle housing 311 and a spring 313. The spring 313 interfaces with the shaft (not shown in FIG. 3E) and with a protrusion (e.g., an elongated protrusion) of the handle 319. The spring 313 is at least partially located or disposed within the handle housing 311. The handle component 310 also includes a handle cover 314. The handle cover 314 may include a grove that may guide the movement of the handle housing 311.

As illustrated in FIG. 3E, the handle cover 314 includes prongs 315 that are bent inwards to the inside of the handle cover 314. The prongs 315 interface with contact features 316 of the handle housing 311 (e.g., a surface that abuts or contacts the prongs 315). The contact between the prongs 315 and the contact features 316 may cause the spring 313 to exert a force that pushes the network component 300 into the chassis of a network device (e.g., into a slot of a network device or towards the back of the network device). This may be due to the compression of the spring as the network component 300 is inserted into the chassis of the network. The contact between the prongs 315 and the contact features 316 may prevent the spring 313 from decompressing which may exert the force that pushes the network component 300 into the chassis of a network device. This force may push connectors of the network component 300 into closer contact with connectors within the network device (e.g., connectors on a fabric of the network device) and may allow the connectors of the network component 300 to be properly connected despite mechanical tolerances of the chassis of the network device.

In one embodiment, as the handle 319 is pulled downwards (e.g., as the handle is pulled away from the network device by a user), the tabs 317 of the handle 319 may push against the prongs 315. This may cause the prongs 315 to be bent outwards (e.g., away from the inside of the handle housing 311). When the prongs 315 are bent outwards, they may no longer engage, contact, or interface with the contact features 316. This may allow the handle component 310 to move away from the network device. For example, if the prongs 315 are no longer in contact with the contact features 315, the spring 313 may be allowed to decompress which may cause the spring 313 to exert a force that pushes the network component 300 out of the chassis of a network device.

Figure 3F:
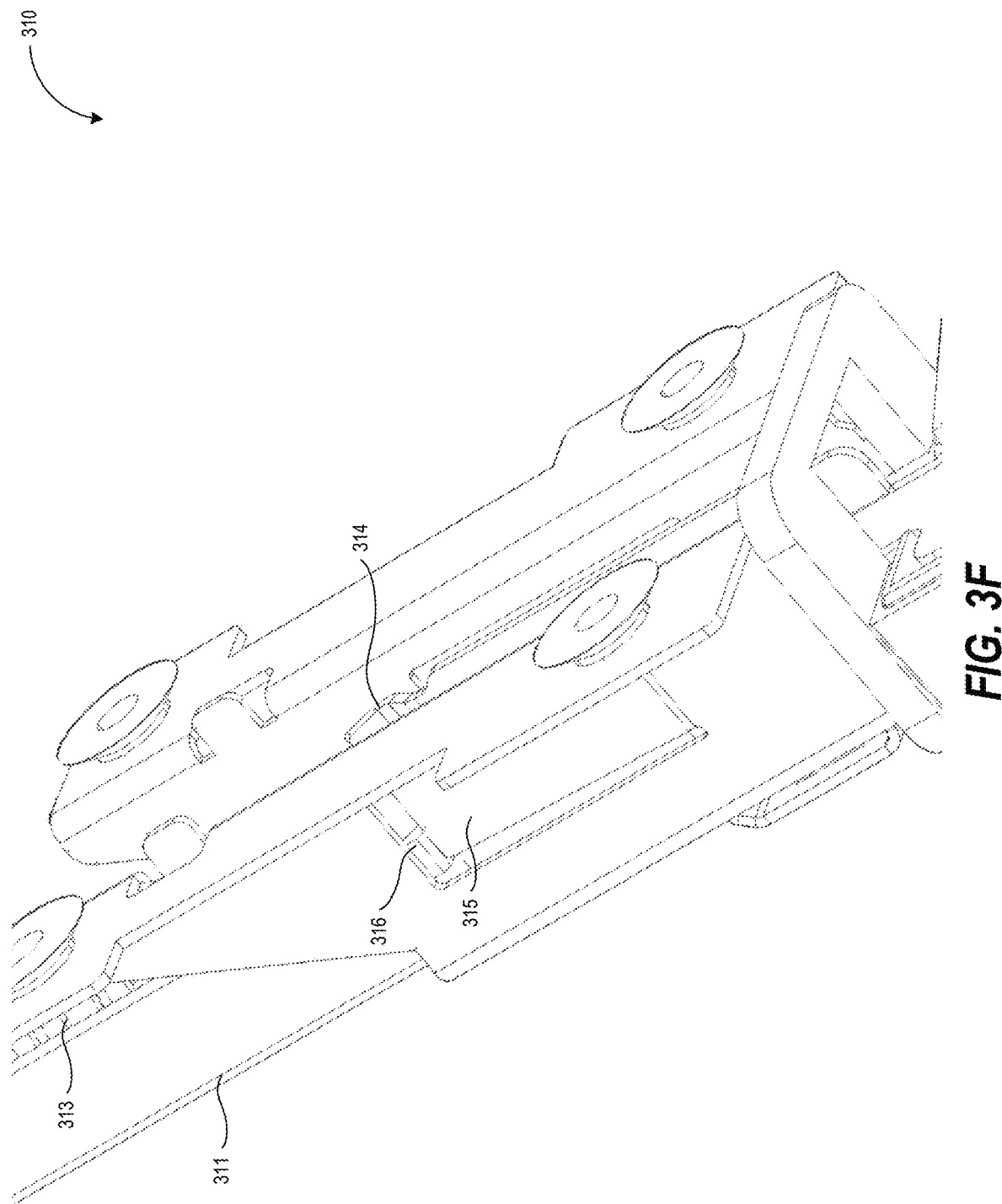
FIG. 3F is a perspective view of a portion of the handle component in accordance with one or more embodiments of the present disclosure.

FIG. 3F is a perspective view of a portion of the handle component 310 in accordance with one or more embodiments of the present disclosure. The handle component 310 includes a handle housing 311 and a spring 313. The spring 313 interfaces with the shaft (not shown in FIG. 3F) and with a protrusion (e.g., an elongated protrusion) of a handle. The spring 313 is at least partially located or disposed within the handle housing 311. The handle component 310 also includes a handle cover 314. The handle cover 314 may include a grove that may guide the movement of the handle housing 311.

As illustrated in FIG. 3F, the handle cover 314 includes prongs 315 that are bent inwards to the inside of the handle cover 314. The prongs 315 interface with contact features 316 of the handle housing 311. The contact between the prongs 315 and the contact features 316 may cause the spring 313 to exert a force that pushes the network component 300 into the chassis of a network device due to the compression of the spring as the network component 300 is inserted into the chassis of the network. The contact between the prongs 315 and the contact features 316 may prevent the spring 313 from decompressing which may exert the force that pushes the network component 300 into the chassis of a network device.

Figure 4A:
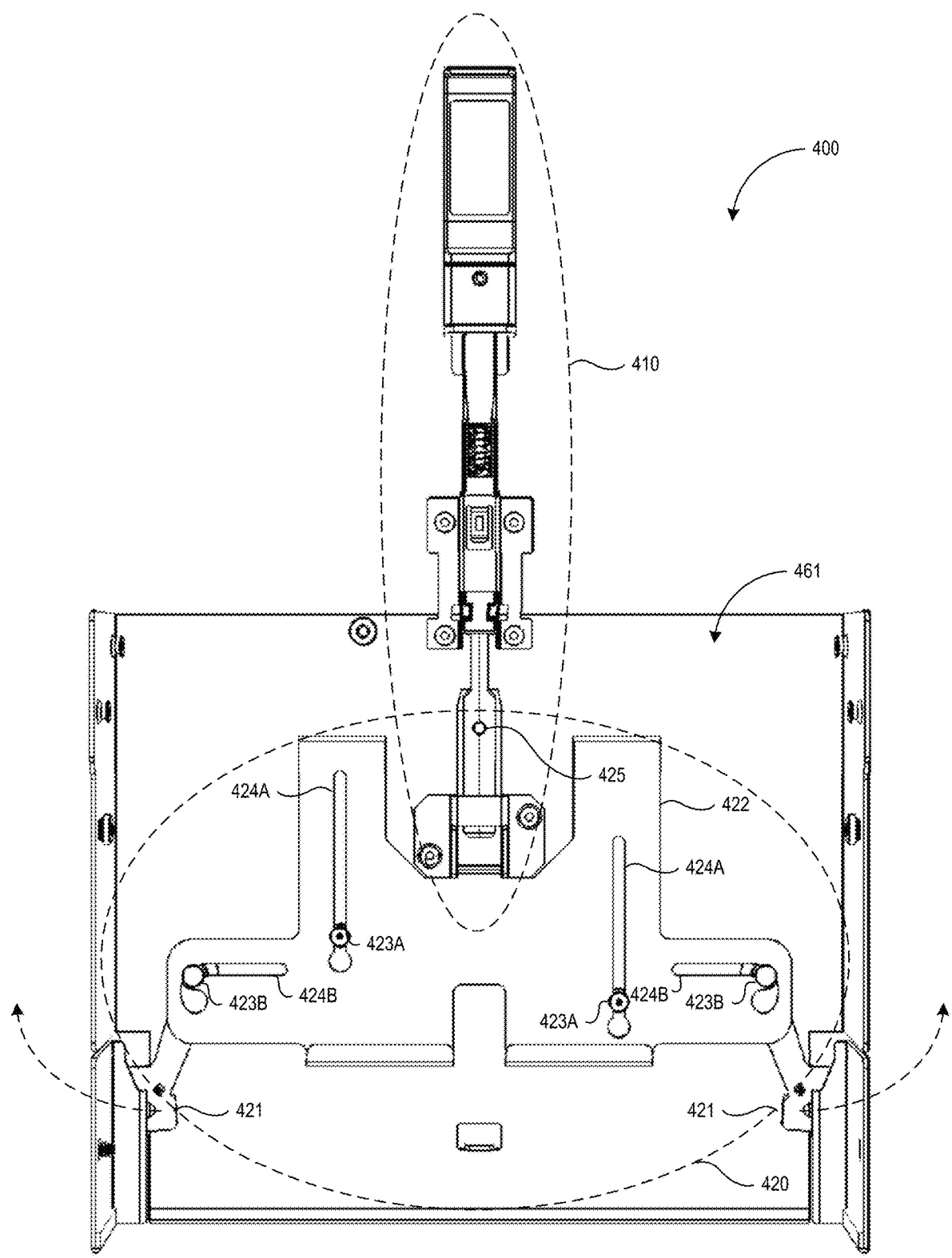
FIG. 4A is an overhead view of the bottom of a securing mechanism, in accordance with one or more embodiments of the present disclosure.

FIG. 4A is an overhead view of the bottom of a securing mechanism 400, in accordance with one or more embodiments of the present disclosure. The securing mechanism 400 includes a latching component 410 and a handle component 420. The securing mechanism may be coupled or attached to a housing 461 of a network component via various attachment features such as screws, buttons, tabs, nuts/bolts, etc. The securing mechanism 400 illustrated in FIG. 4A may be in an unlocked/open/unsecured configuration which may allow the removal of the network component from a chassis of a network device. As illustrated in FIG. 4A, the latching component 410 may be located or disposed within the housing 361 of the network component. Also as illustrated in FIG. 4A, the handle component 420 may be partially located or disposed within the housing 361.

In one embodiment, the latching component 420 includes engagement features 421. The engagement features 421 may have a paw shape or a wrench shape. The paw shape of the engagement features 421 may interface (e.g., contact, push against, etc.) retention features in the chassis of the network device. The engagement features 421 may be in a second position, as illustrated in FIG. 4A. This may allow the network component to be removed from the chassis of a network device because the engagement feature 421 may not interface with retention features in the chassis of the network device when the engagement features 421 are in the second position. The engagement feature 421 may move to a first position when the securing mechanism 400 is in a locked/secured/closed configuration, as illustrated by the curved dashed arrows. For example, if a user pushes the handle component 410 downward (e.g., towards the inside of the chassis of the network device), the engagement features 421 may move to the first position illustrated in FIG. 3A.

In one embodiment, the latching component 420 includes a plate 422 coupled to engagement features 421 and the handle component 410. The plate 422 includes grooves 424A and 423B. Screws 424A couple the plate 422 to the housing 361. The screws 424A allow the plate 422 to move between a first position (illustrated in FIG. 4A) and a second position. The plate 422 may be in the first position when the securing mechanism 400 is in the locked/closed/secured configuration. The screws 424B allow the engagement features 421 to move in the directions indicated by the dashed arrows. For example, when a user pushes the handle component 410, the plate 422 may move downwards (to a first position) and the each engagement feature 421 may rotate upwards (as indicated by the dashed arrows) to a first position.

Figure 4B:
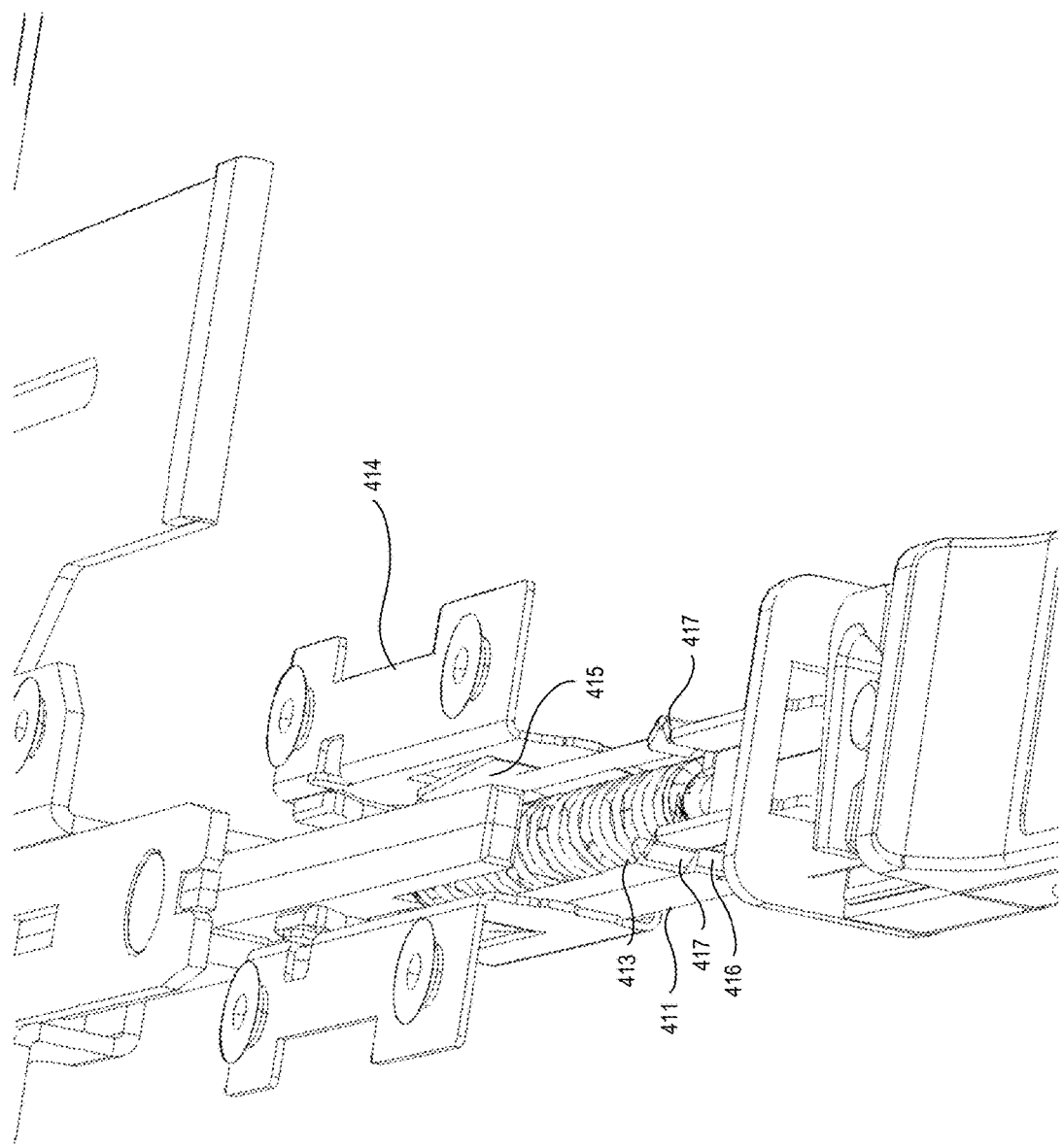
FIG. 4B is a perspective view of a portion of the handle component in accordance with one or more embodiments of the present disclosure.

FIG. 4B is a perspective view of a portion of the handle component 410 in accordance with one or more embodiments of the present disclosure. The handle component includes a handle housing 411 and a spring 413. The spring 413 interfaces with a shaft (not shown in FIG. 4B) and with a protrusion (e.g., an elongated protrusion) of the handle 419. The spring 413 is at least partially located or disposed within the handle housing 411. The handle component 410 also includes a handle cover 414. The handle cover 414 may include a grove that may guide the movement of the handle housing 411.

As illustrated in FIG. 4B, the handle cover 414 includes prongs 415 that are bent inwards to the inside of the handle cover 414. The prongs 415 no longer interface, contact, or engage with contact features 416 of the handle housing 411 because the tabs 417 previously bent the prongs 415 outward allowing the spring to push the contact features 416 past the prongs 415. This allows the spring 313 to decompress and exert a force away from the chassis of the network device. This may facility the removal of the network component from the chassis of the network device. For example, the force caused by the decompression of the spring 413 may help push the network component out of the chassis of the network device.

In one embodiment, as the handle 419 is pushed upwards (e.g., as the handle is pushed towards the network device by a user), the e. The spring 413 may compress and the contact features 416 may be pushed past the ends of the prongs 415. This may allow the contact features 416 to interface with the prongs 416 which may prevent the spring 413 from decompressing, as discussed above.

Figure 5:
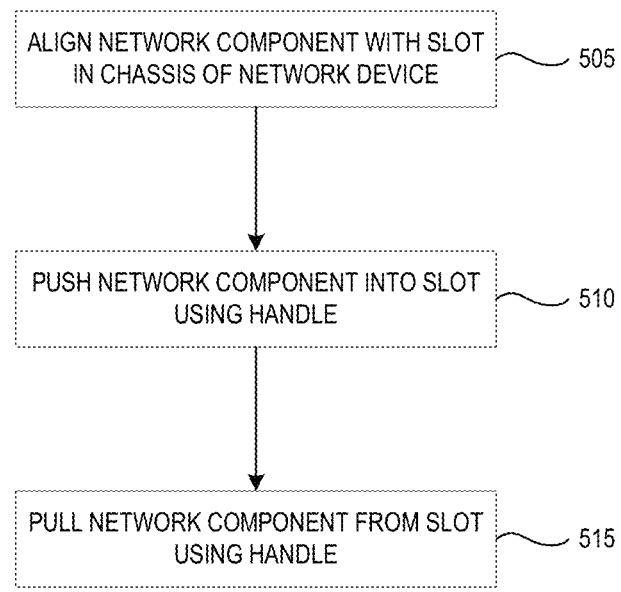
FIG. 5 is a flow diagram of a method of inserting a network component into a network device and removing the network component from the network device, in accordance with one or more embodiments of the present disclosure.

FIG. 5 is a flow diagram of a method 500 of inserting a network component into a network device and removing the network component from the network device, in accordance with one or more embodiments of the present disclosure. It should be appreciated that the blocks of the method 500 in FIG. 5 can be performed in differing orders, groupings, or subsets than shown in FIG. 6, for various purposes or user preferences. At block 505, a network component (e.g., a line card) is aligned with a slot in a chassis of a network device. For example, the housing of the network component may be aligned with grooves, rails, etc., that form the slot in the chassis of the network device.

The network component is pushed into the slot using a handle of a handle component at block 510. As discussed above, pushing the handle of the handle component may compress a spring within the handle component. As the spring is compressed, a portion of the housing of the handle may move into the network component. A set of contact features may be pushed past a set of prongs of a housing cover. The handle component may cause a set of engagement features to interface (e.g., contact, push against, etc.) retention features in the chassis of the network device. For example, the engagement features may rotate until they interface or engage with the retention features. When the handle is no longer pushed (e.g., when the user stops pushing the handle), the spring may not be able to decompress because the set of contact features may interface or engage the set of prongs, as discussed above. This may cause the spring to exert a force that pushes the network component into the chassis which may allow the securing mechanism to help absorb mechanical tolerances of the chassis and help ensure that the connectors of the network component are properly inserted into connectors in the chassis.

At block 515, the network component is pulled from the slot using the handle. As discussed above, pulling the handle component may move a set of tabs past the set of prongs. The set of tabs may push the set of prongs outwards so that the set of prongs no longer interface or engage with the set of contact features. Pulling the handle also rotates the engagement features such that the engagement features no longer interface or engage with the retention features. This may allow the spring to decompress and exert a force towards the outside of the chassis (e.g., exert a force towards the direction in which the handle is pulled). This may allow the network component to be removed from the chassis more easily.

Although the present disclosure may refer to rails, slits, slots, grooves, tabs, holes, notches, prongs, springs, etc., which may be used to interface/engage with different components, prevent movement of different components, etc., various other mechanical features or components may be used in other embodiments.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. In addition, the term "set" includes one or more items within the set. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An apparatus, comprising:
a latching component comprising first and second engagement features at first and second opposing portions of the latching component, and configured to:
secure a network component via the first and second engagement features within a chassis of a network device when the apparatus is in a first configuration; and
allow removal of the network component from the chassis of the network device when the apparatus is in a second configuration; and
a handle component coupled to the latching component between the first and second engagement features, wherein the handle component is accessible from a first face of the network component, wherein the handle component is oriented away from the first face, and wherein the handle component is configured to:
facilitate the removal of the network component from the chassis when the apparatus is in the first configuration;
facilitate the insertion of the network component into the chassis when the apparatus is in the second configuration; and
wherein the handle component includes:

a handle housing;
a shaft having a longitudinal axis extending between a first end and a second end, the first end disposed within the handle housing and the shaft disposed at least partially within the handle housing; and
a spring disposed within the handle housing to contact the first end of shaft and exert a first force to the handle component in a direction parallel to the longitudinal axis of the shaft.

2. The apparatus of claim 1, wherein:
the first engagement feature is configured to interface with a first retention feature in the chassis of the network device when the apparatus is in the first configuration; and
the second engagement feature is configured to interface with a second retention feature in the chassis of the network device when the apparatus is in the first configuration.

3. The apparatus of claim 2, wherein each of the first engagement feature and the second engagement feature is rotatable between a first position and a second position.

4. The apparatus of claim 2, wherein the latching component further comprises a plate, wherein the plate is in a first position when the apparatus is in the first configuration, and wherein the plate is in a second position when the apparatus is in the second configuration.

5. The apparatus of claim 1, wherein the handle housing comprises a set of contact features configured to interface with a set of prongs of a handle cover.

6. The apparatus of claim 5, wherein the handle component further comprises a set of tabs disposed within the handle housing, wherein the set of tabs is configured to move the set of prongs to allow the removal of the network component from the chassis of the network device.

7. The apparatus of claim 1, wherein the spring exerts the first force that pushes the network component towards a back of the chassis of the network device when the apparatus is in the first configuration.

8. The apparatus of claim 7, wherein the spring exerts a second force that pushes the network component towards a front of the chassis of the network device when the apparatus is in the second configuration.

9. The apparatus of claim 1, wherein the handle component is disposed along a central axis of the apparatus.

10. The apparatus of claim 1, wherein the latching component is disposed within a housing of the network component.

11. The apparatus of claim 1, wherein a portion of the handle component is disposed within a housing of the network component.

12. A network component, comprising:
a housing; and
a securing mechanism disposed at least partially within the housing, wherein the securing mechanism comprises:
a latching component comprising first and second engagement features at first and second opposing portions of the latching component, and configured to:
secure a network component within an chassis of a network device when the securing mechanism is in a first configuration; and
allow removal of the network component from the chassis of the network device when the securing mechanism is in a second configuration; and
a handle component coupled to the latching component between the first and second engagement features,
wherein the handle component is accessible from a first face of the network component, wherein the handle component is oriented away from the first face, and wherein the handle component is configured to:
facilitate the removal of the network component from the chassis when the securing mechanism is in the first configuration; and
facilitate the insertion of the network component into the chassis when the securing mechanism is in the second configuration;
wherein the handle component includes:
a handle cover including a set of prongs;
a handle housing including a set of contact features configured to interface with the set of prongs of the handle cover;
a shaft disposed within the handle housing;
a spring configured to interface with the shaft, wherein the spring is disposed within the handle housing.

13. The network component of claim 12, wherein the latching component comprises:
the first engagement feature is configured to interface with a first retention feature in the chassis of the network device when the securing mechanism is in the first configuration; and
the second engagement feature is configured to interface with a second retention feature in the chassis of the network device when the securing mechanism is in the first configuration.

14. The network component of claim 13, wherein each of the first engagement feature and the second engagement feature is rotatable between a first position and a second position.

15. The network component of claim 13, wherein the latching component further comprises a plate, wherein the plate is in a first position when the securing mechanism is in the first configuration, and wherein the plate is in a second position when the securing mechanism is in the second configuration.

16. The network component of claim 12, wherein the handle component further comprises a set of tabs disposed within the handle housing, wherein the set of tabs is configured to move the set of prongs to allow the removal of the network component from the chassis of the network device.

17. A method, comprising:
aligning a network component with a slot in a chassis of a network device, wherein the network component comprises a securing mechanism, and wherein the securing mechanism comprises a latching component and a handle component;
pushing the handle component towards the inside of the chassis of the network device, wherein the handle component is accessible from a first face of the network component, wherein the handle component is oriented away from the first face, and wherein pushing the handle component causes:
a spring of the handle component to compress;
a set of contact features to interface with a set of prongs of a handle cover; and
a set of engagement features of the latching component to engage with a set of retention features in the chassis of the network device to secure the network component in the chassis; and
pulling the handle away from the inside of the chassis of the network device, wherein pulling the handle causes:
a set of tabs to interface with the set of prongs;

the set of contact features to move past the set of prongs;

the spring to decompress; and the set of engagement features to disengage with the set of retention features to allow removal of the network component from the chassis.

18. The method of claim 17, wherein pushing the handle and pulling the handle causes the set of engagement features to rotate between a first position and a second position.

19. The method of claim 17, wherein pushing the handle causes the spring to exert a first force that pushes the network component towards a back of the chassis of the network device.

20. The method of claim 17, wherein pulling the handle causes the spring to decompress to exert a second force that pushes the network component towards a front of the chassis of the network device.

* * * * *